(12) United States Patent
Wang

(10) Patent No.: US 9,312,351 B2
(45) Date of Patent: Apr. 12, 2016

(54) FLOATING GATE FLASH CELL WITH EXTENDED FLOATING GATE

(71) Applicant: WaferTech, LLC, Camas, WA (US)

(72) Inventor: Yimin Wang, Camas, WA (US)

(73) Assignee: WAFERTECH, LLC, Camas, WA (US)

( * ) Notice: Subject to any disclaimer, the term of this patent is extended or adjusted under 35 U.S.C. 154(b) by 22 days.

(21) Appl. No.: 14/179,344

(22) Filed: Feb. 12, 2014

(65) Prior Publication Data
US 2015/0228741 A1    Aug. 13, 2015

(51) Int. Cl.
| | |
|---|---|
| H01L 29/76 | (2006.01) |
| H01L 29/788 | (2006.01) |
| H01L 29/423 | (2006.01) |
| H01L 27/115 | (2006.01) |
| H01L 21/28 | (2006.01) |

(52) U.S. Cl.
CPC .... *H01L 29/42364* (2013.01); *H01L 21/28273* (2013.01); *H01L 27/11521* (2013.01); *H01L 29/42328* (2013.01)

(58) Field of Classification Search
CPC .............. H01L 29/788; H01L 29/7841; H01L 27/10802; H01L 27/11517; H01L 29/42324; H01L 29/42328; H01L 29/66825
USPC .......................................... 257/314, 315, 316
See application file for complete search history.

(56) References Cited

U.S. PATENT DOCUMENTS

| | | | | |
|---|---|---|---|---|
| 6,159,801 A | * | 12/2000 | Hsieh et al. ................... | 438/259 |
| 2004/0061165 A1 | * | 4/2004 | Ding .............................. | 257/314 |
| 2006/0131633 A1 | * | 6/2006 | Bhattacharyya ............... | 257/314 |

* cited by examiner

*Primary Examiner* — Hoai V Pham
(74) *Attorney, Agent, or Firm* — Duane Morris LLP

(57) ABSTRACT

Provided is a floating gate flash cell and method for forming the same. The flash includes two floating gate transistors and a common source area therebetween. Each floating gate transistor includes a floating gate having a central portion disposed over a substrate surface and opposed lateral edges that extend into trenches and below the substrate surface. A control gate is disposed over said floating gate with a control gate dielectric between the floating gate and the control gate. The floating gates have side edges that are orthogonal to the opposed lateral edges and a common source area which is a substrate diffusion area, is positioned between respective facing side edges of the floating gates.

20 Claims, 10 Drawing Sheets

– continued –

FLOATING GATE FLASH CELL WITH EXTENDED FLOATING GATE

TECHNICAL FIELD

The disclosure relates to floating gate transistors and flash cells and methods for forming the same. More particularly, the disclosure relates to floating gate transistors and flash cells having extended floating gates.

BACKGROUND

A flash memory is a non-volatile storage device that can be electrically erased and reprogrammed. Flash memories are commonly used in memory cards, USB flash drives and solid state drives for general storage and transfer of data between computers and other digital products. Flash memory devices typically store information in an array of memory cells made using floating gate transistors.

A floating gate transistor is a field effect transistor having a structure similar to a conventional metal oxide semiconductor field effect transistor ("MOSFET.") Floating gate MOSFETs are distinguished from conventional MOSFETs because the floating gate transistor includes two gates instead of one. In addition to an upper control gate, a floating gate transistor includes an additional floating gate between the control gate and above the transistor channel, but completely electrically isolated by an insulating layer such as an oxide layer that completely surrounds the floating gate.

This electrically isolated floating gate creates a floating node in direct current "DC" operation with a number of inputs or secondary gates such as the control gate, formed above the floating gate and electrically isolated from it. These secondary gates or inputs are capacitively connected to the floating gate. The coupling ratio, Cr, between the control gate or other secondary gate, and the floating gate is determined by the capacitances of the dielectric between the floating gate and the control gate and also the dielectric between the floating gate and the source line. The dielectric between the floating gate and the source line is commonly the gate oxide or other dielectric between the floating gate and the substrate in the area in which the floating gate overlaps the source line diffusion region. Providing a high coupling ratio and minimizing floating gate cell leakage are useful to programming efficiency of the flash cell and this is especially important as the cell size shrinks.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

FIGS. 1, 2, 3, 8A-8C, 9A-9C, 10A-10C and 11A-11C represent a sequence of processing operations according to other embodiments of the disclosure.

FIGS. 1-3 are cross-sectional views showing a sequence of processing operations that represent initial of processing operations according to various embodiments of the disclosure;

FIGS. 4A-4C, 5A-5C, 6A-6C, 7A-7C 8A-8C, 9A-9C, 10A-10C, and 11A-11C each include the following format. The "A" and "B" figures are both cross-sectional views, and the "C" figure is a plan view that identifies the location of the "A" and "B" figures.

FIGS. 4A-4C through FIGS. 7A-7C illustrate a sequence of further processing operations performed upon the structure shown in FIG. 3, according to a first embodiment of the disclosure; and FIGS. 8A-8C through 11A-11C illustrate a sequence of further processing operations performed upon the structure shown in FIG. 3, according to a second embodiment of this disclosure.

DETAILED DESCRIPTION

Various embodiments of the disclosure provide a flash cell device and floating gate transistors with extended floating gates that provide an increased coupling ratio.

The coupling ratio can be expressed as $Cr=C1/(C1+C2)$, where Cr is the coupling ratio, C1 is the capacitance of the dielectric between the floating gate and the source line, and C2 is the capacitance between the floating gate and control gate. A higher C1 capacitance therefore provides a higher coupling ratio.

Various embodiments of the disclosure provide a flash cell device and floating gate transistors with extended floating gates formed such that the area between the extended floating gate and the source line is increased to produce a higher C1 and achieve a desirably higher coupling ratio.

Figure 1:
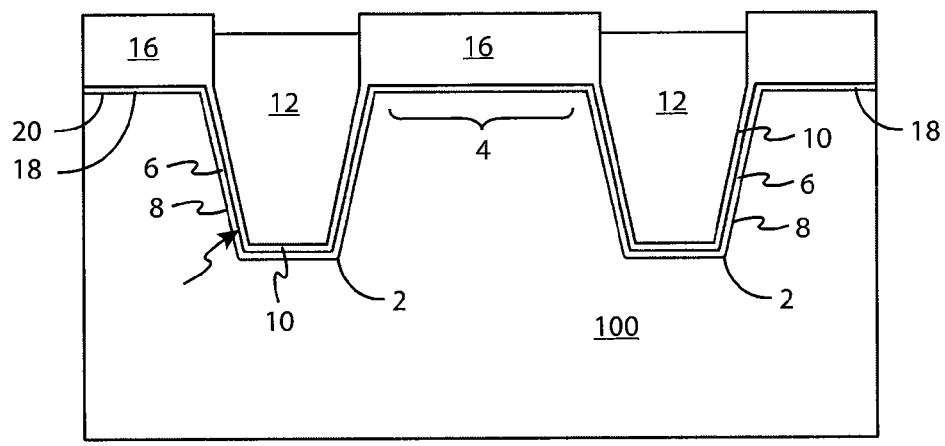
FIGS. 1, 2, 3, 4A-4C, 5A-5C, 6A-6C and 7A-7C represent a sequence of processing operations according to various embodiments of the disclosure.

FIG. 1 is a cross-sectional view showing two filled trenches 2 spaced apart from one another and formed within substrate 100. Substrate 100 is formed of silicon or other suitable materials. Region 4, disposed between the two trenches 2, is the region in which an extended floating gate will be formed. Within each filled trench 2, oxide liner 6 is formed along sidewalls 8 and nitride layer 10 is disposed on oxide liner 6. Trench fill dielectric 12 is disposed over nitride layer 10 and fills trenches 2. Upper nitride layer 16 is formed over pad oxide 18 over substrate surface 20. Various thicknesses of the described features are used in various embodiments. In some embodiments, the thickness of oxide liner 6 ranges from about 100 to 200 angstroms, but other thicknesses are used in other embodiments. In some embodiments, the thickness of nitride layer 10 ranges from about 40-300 angstroms, but other thicknesses are used in other embodiments. Various methods are used to form the structure shown in FIG. 1. In an embodiment, pad oxide 18 and upper nitride layer 16 are first formed over substrate surface 20 then patterned to define trench openings, then an etching operation is carried out to form trenches 2. This is then followed by the formation of oxide liner 6, nitride layer 10 and the trenches 2 are then filled with trench dielectric 12. Other methods are used in other embodiments.

Figure 2:
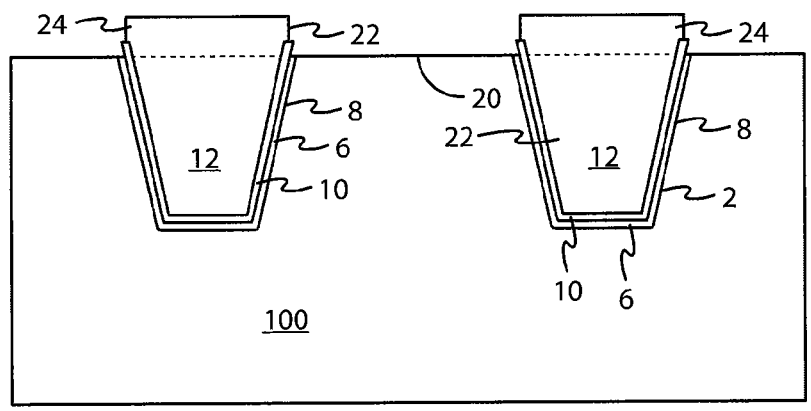

FIG. 2 shows the structure in FIG. 1 after nitride 16 and pad oxide 18 are removed from over substrate surface 20. Various methods are used. Shallow trench isolation STI, structure 22 includes the materials filling trenches 2 and includes protruding portions 24. FIG. 2 shows that each STI structure 22 has an associated protruding portion 24 that protrudes above substrate surface 20, as indicated by the dashed line.

Figure 3:
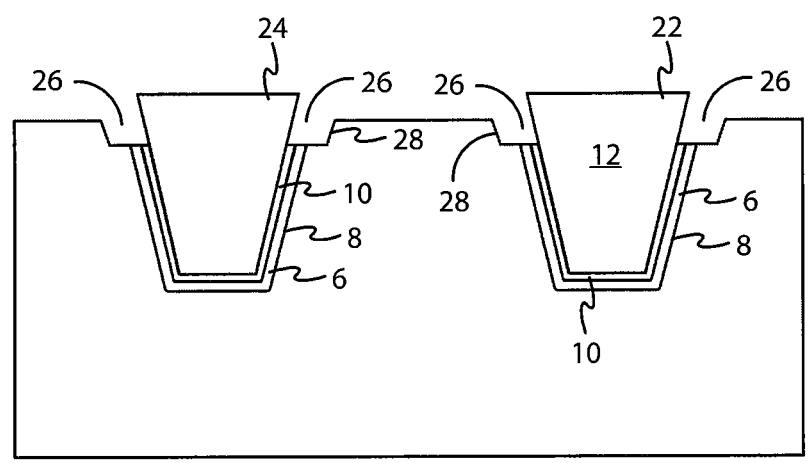

FIG. 3 shows the structure of FIG. 2 after divots 26 have been formed. Divots 26 are recesses that extend downwardly from substrate surface 20 along each of the opposed upper edges of STI structure 22. Divots 26 are formed by a sequence of operations including a nitride wet etch back operation used to etch exposed portions of nitride layer 10 followed by an oxide liner wet etch operation that etches parts of oxide liner 6 to expose sidewalls 8 of trench 2. In some embodiments, this is followed by a wet etch operation that thins the substrate material and increases the width of divot 26. In some embodiments, particularly when substrate 100 is silicon, this is a silicon wet etch operation. Outer sidewalls 28 of divots 26 are recessed relative to original upper portions of sidewalls 8 in some embodiments such as shown in FIGS. 1 and 2.

Figure 4A:
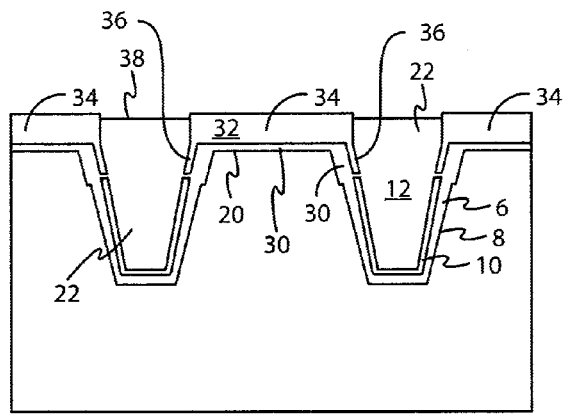
Figure 4B:
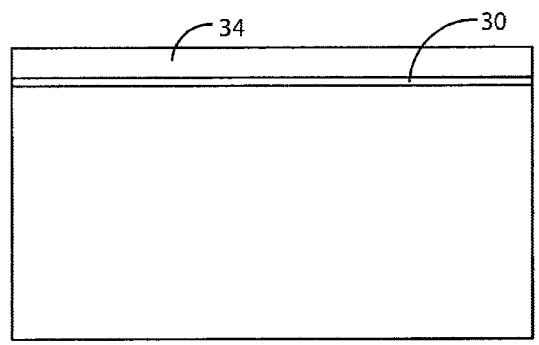
Figure 4C:
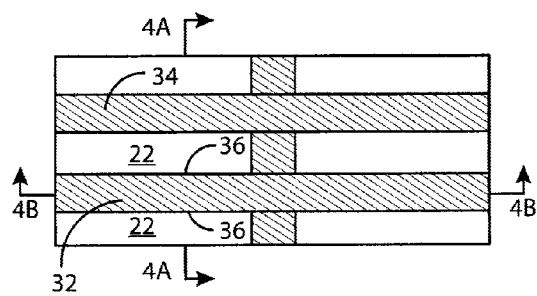

FIGS. 4A-4C represent a further processing step carried out upon the structure shown in FIG. 3, according to a first embodiment of the disclosure.

FIGS. 4A-4C include the cross-sectional views of FIGS. 4A and 4B and the top plan view of FIG. 4C. FIG. 4C shows the relative locations of the cross-sectional views of FIGS. 4A and 4B. FIG. 4A is the cross-section taken along line 4A-4A of FIG. 4C and FIG. 4B is the cross-section taken along line 4B-4B of FIG. 4C The same format is also true for FIGS. 5A-5C through FIGS. 11A-11O.

FIG. 4A shows the structure of FIG. 3 after floating gate oxide 30 is formed over substrate surface 20 and within previous divots 26, which are now filled. FIG. 4A also shows floating gate 34 that includes central portion 32 formed over substrate surface 20 and opposed lateral edge portions 36 that extend downwardly into former divots 26 and below substrate surface 20. Discrete floating gate 34 is formed, in some embodiments, by depositing a floating gate material over the structure shown in FIG. 3. In some embodiments of the disclosure, the floating gate material is polysilicon but other materials are used in other embodiments. In some embodiments, an implantation operation is carried out upon the deposited floating gate material to dope the material as desired. In some other embodiments, the implantation operation is not performed. The floating gate material is conformally formed over substrate surface 20 (with floating gate oxide 30 disposed therebetween) and also disposed over protruding portion 24 of FIG. 3. After deposition, a chemical mechanical polishing, CMP, operation is carried out to remove the floating gate material from over protruding portion 24 over STI structures 22 to produce the structure shown in FIGS. 4A-4C. FIG. 4C shows the relative locations of the cross-sectional views of FIGS. 4A and 4B. FIG. 4A is the cross-section taken along line 4A-4A of FIG. 4C and FIG. 4B is the cross-section taken along line 4B-4B of FIG. 4C. In some embodiments, an oxide etch back operation is carried out to recede the top surface 38 of STI structure 22 below the top surface of central portion 32 of floating gate 34.

Figure 5A:
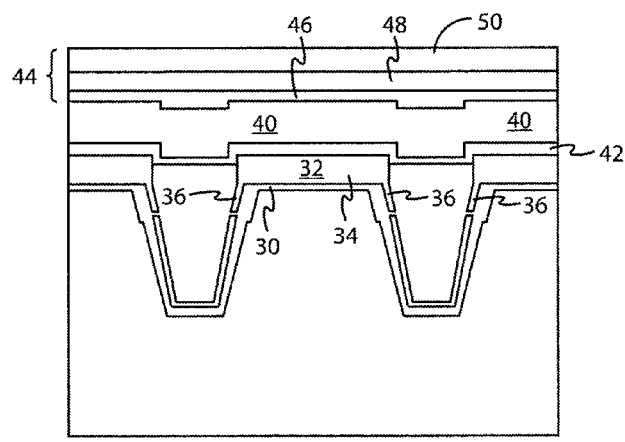
Figure 5B:
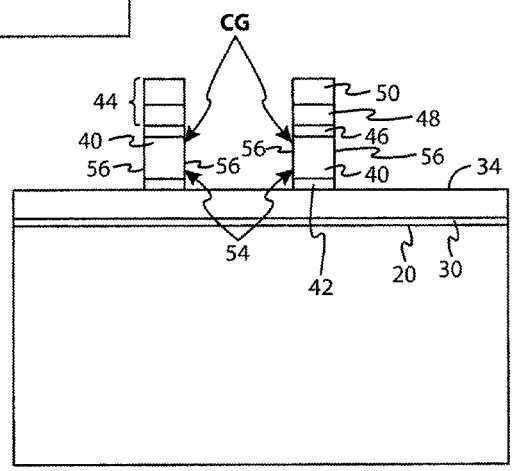
Figure 5C:
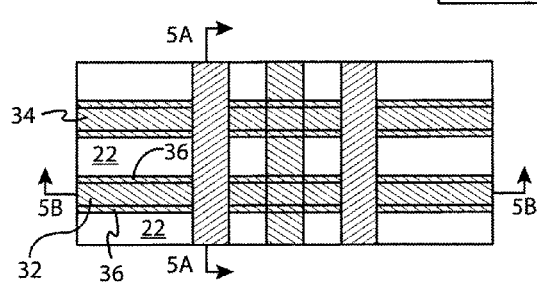

FIGS. 5A-5C represent the structure shown in FIGS. 4A-4C after multiple further processing steps have been carried out, according to the first embodiment of the disclosure. FIG. 5A shows control gate dielectric 42, control gate 40, and control gate cap structure 44 that includes lower nitride layer 46, middle oxide layer 48 and upper nitride layer 50 in some embodiments. In other embodiments, a single dielectric is used for control gate cap structure 44 and in other embodiments, other combinations of dielectrics are used for control gate cap structure 44. Control gate 40 is formed of polysilicon in some embodiments but is formed of other suitable control gate materials and other embodiments.

Control gate dielectric 42 is formed of various materials in various embodiments. In various embodiments of the disclosure, control gate dielectric 42 is a composite material formed of multiple dielectric layers. In an embodiment, control gate dielectric is formed of a lower oxide layer having a thickness of about 30-80 angstroms, a central nitride layer having a thickness of about 40-100 angstroms and an upper oxide layer having a thickness of about 20-50 angstroms but other combinations of dielectric materials and other thicknesses are used in other embodiments.

Control gate 40 includes a thickness of about 700-1200 angstroms in an embodiment but other suitable thicknesses are used in other embodiments. FIG. 5B shows that two floating gate structures are formed adjacent one another and spaced apart from one another by distance 54. Control gates 40 have opposed sidewalls 56 shown in FIG. 5B. FIG. 5A is the cross-sectional view along the direction orthogonal to the direction shown in FIG. 5B and shows that, along the direction orthogonal to the direction shown in FIG. 5B, the floating gate is a discrete feature that has lateral edge portions 36 that extend downwardly below substrate surface 20 and into former divots 26. Lateral edge portions 36 are transverse to, i.e. orthogonal to, edges 56 of control gate 40 FIG. 5B. FIG. 5B shows that, at this stage in processing, floating gate 34 is a continuous feature in the direction orthogonal to lateral edges 36, but it will be seen in later figures that control gate 34 is patterned and will have sidewalls along edges 56 and transverse, i.e., orthogonal to lateral edge portions 36.

FIGS. 5A and 5B together show that the control gates 40 of two floating gate structures are discrete and formed adjacent one another and spaced apart from one another by distance 54. FIG. 5A shows that, in the direction orthogonal to the view shown in FIG. 5B, the floating gates 34 include lateral edges that extend downwardly into divots.

Figure 6A:
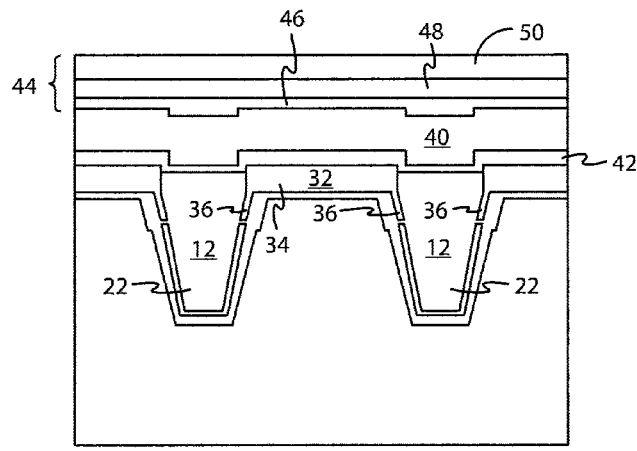
Figure 6B:
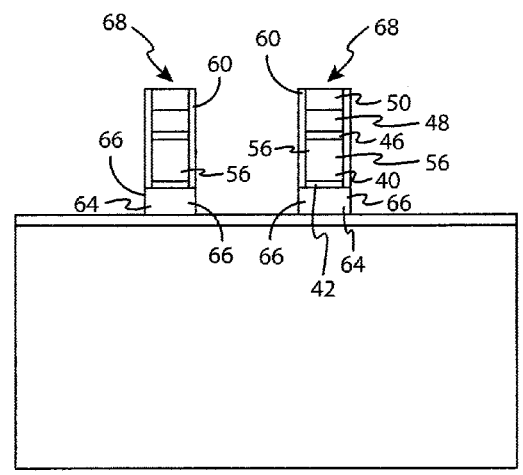
Figure 6C:
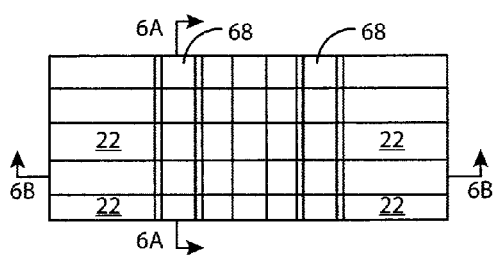

FIGS. 6A-6C show the structure shown in FIGS. 5A-5C after subsequent processing operations have taken place. FIGS. 6A-6C show the structure of FIGS. 5A-5C after control gate sidewall spacers 60 have been formed alongside control gate 40 and control gate cap structure 44. In some embodiments, the sidewall spacers 60 are oxides or nitrides or both. In an embodiment, sidewall spacers 60 include a layer of oxide, a layer of nitride, and a further layer of oxide with the nitride layer interposed between the two oxide layers. The structure shown in FIGS. 6A-6C, also show the structure after a floating gate photolithography and etching operation have been carried out to pattern the floating gates and form patterned floating gates 64. Patterned floating gates 64 include side edges 66 that are transverse, i.e., orthogonal, to lateral edge portions 36 shown in FIG. 6A. The patterned floating gates 64, along with control gate 40, patterned control gate cap structure 44 and sidewall spacers 60, form floating gate transistor structure 68.

Figure 7A:
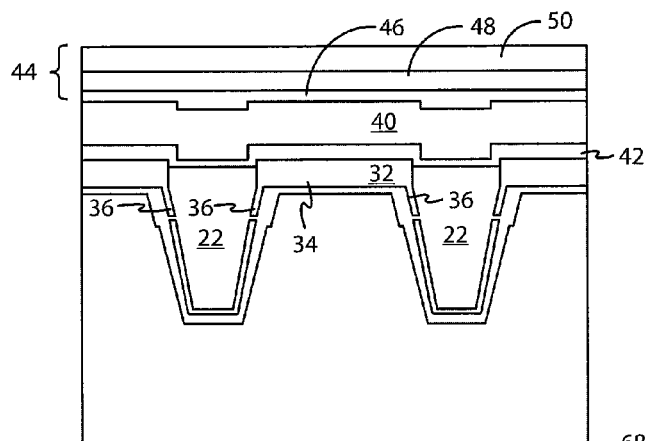
Figure 7B:
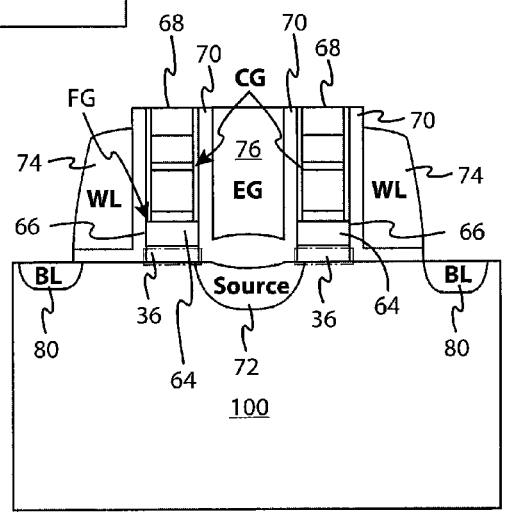
Figure 7C:
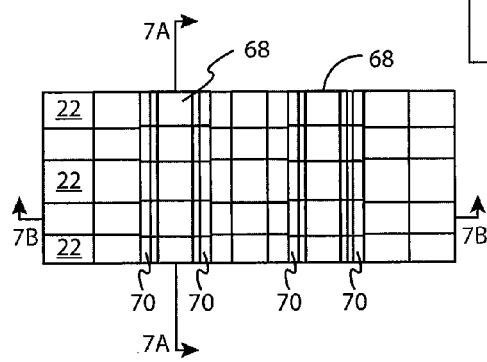

FIGS. 7A-7C show the structure of FIGS. 6A-6C after floating gate spacers 70 have been formed alongside the floating gate transistor structures 68 shown in FIGS. 6A-6C, and after a source implantation and drive in operations have been used to form common source 72. FIGS. 7A-7C also show word lines 74 and erase gate 76. In an embodiment, word lines 74 and erase gate 76 are formed in the same deposition operation and are formed of polysilicon, but other methods and other materials are used in other embodiments. FIGS. 7A-7C also show bit line diffusion regions 80 formed within substrate 100. Although FIG. 7B is taken along line 7B-7B of FIG. 7C, FIG. 7B also shows lateral edge portions 36 in dashed lines because these features are in front of and behind the plane of the drawing figure of FIG. 7B. FIGS. 7A-7C show an embodiment in which control gate 40 is aligned directly over patterned floating gate 64 and does not extend laterally past either side edge 66 of patterned floating gate 64.

Figure 8A:
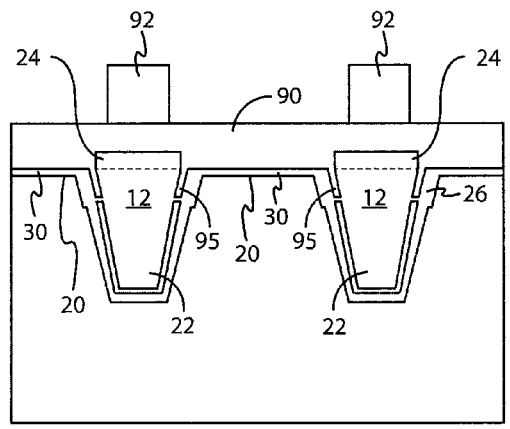
Figure 8B:
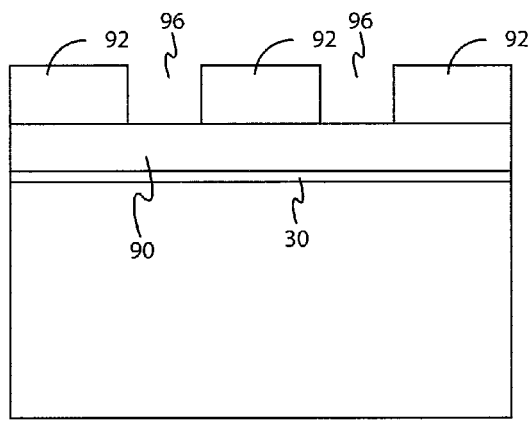
Figure 8C:
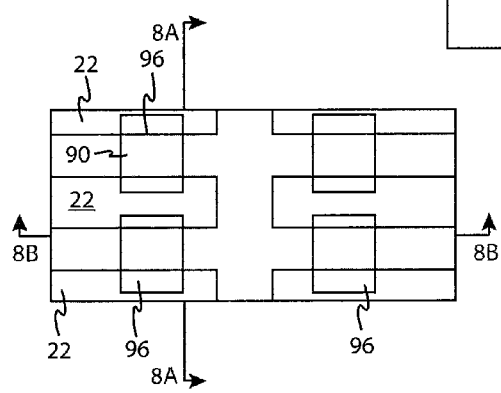

FIGS. 8A-8C represent a further processing step carried out upon the structure shown in FIG. 3, according to a second embodiment of the disclosure.

FIGS. 8A-8C show the structure of FIG. 3 after floating gate oxide 30 is formed over substrate surface 20 and within previous divots 26, which are now filled. Floating gate oxide 30 includes a thickness of about 80-105 angstroms in some embodiments, but other thicknesses are used in other embodiments. FIG. 8A also shows floating gate material 90 formed over substrate surface 20 and also over protruding portions 24 of STI structures 22. In various embodiments, floating gate material 90 is formed of polysilicon, but other suitable materials are used in other embodiments. Floating gate material 90 includes a thickness of about 300-600 angstroms in some embodiments, but other thicknesses are used in other embodiments. FIGS. 8A-8C also show patterned nitride material 92 formed over floating gate material 90. Patterned nitride material 92 includes voids 96 and an oxidation operation will be used to oxidize exposed portions of floating gate material 90 FIG. 8A also shows that floating gate material 90 includes protrusions 95 that extend downwardly into former divots 26 and to a depth below substrate surface 20.

Figure 9A:
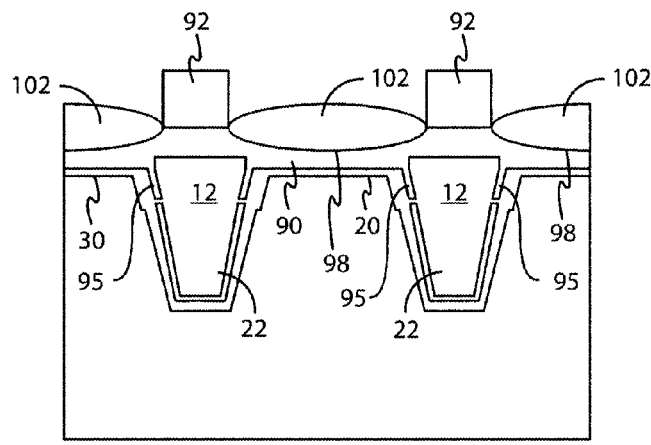
Figure 9B:
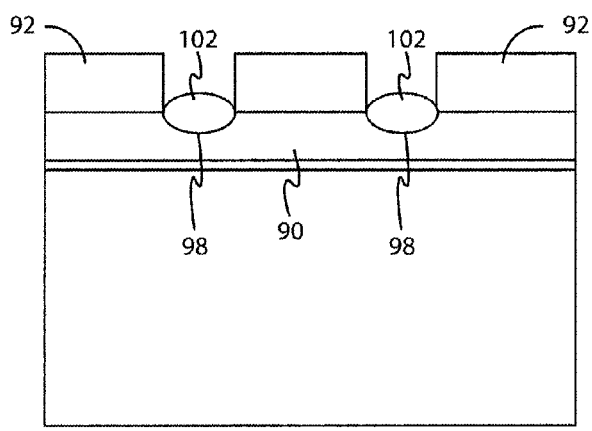
Figure 9C:
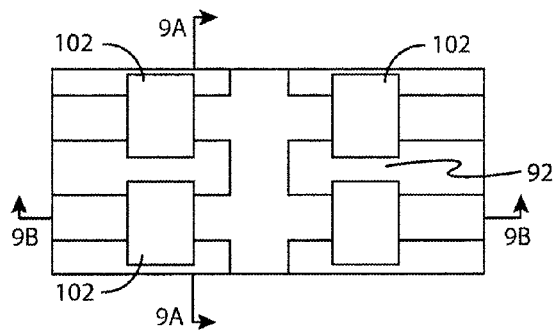

FIGS. 9A-9C show the structure shown in FIGS. 8A-8C after an oxidation operation has been carried out. Using patterned nitride 92 as a blocking mask, an oxidation operation is carried out to oxidize exposed portions of floating gate material 90. The oxidation operation creates bi-convex shaped control gate oxides 102 and produces concave upper surfaces 98 of floating gate material 90 although other shapes are produced in some embodiments. Various oxidation conditions are used. Control gate oxide 102 includes a thickness of about 800-1100 angstroms in some embodiments, but other suitable thicknesses are achieved in other embodiments.

Figure 10A:
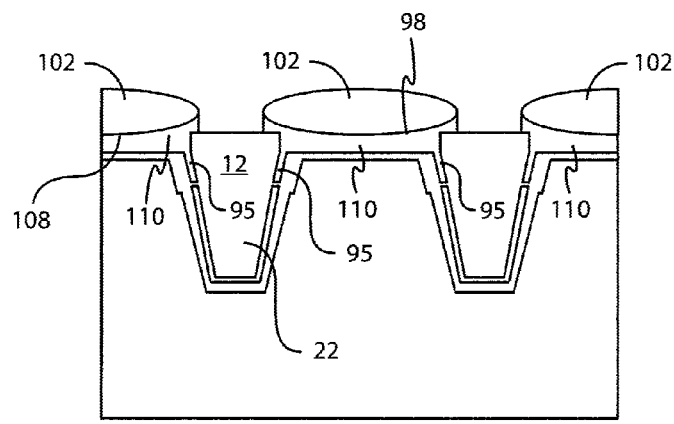
Figure 10B:
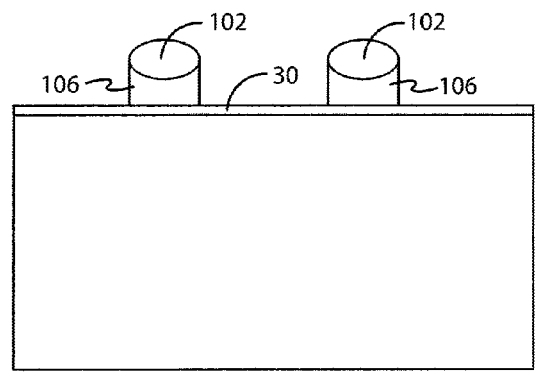
Figure 10C:
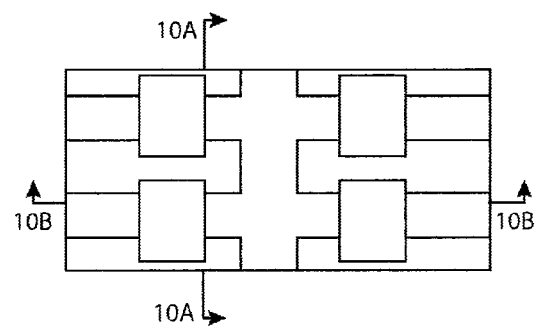

FIGS. 10A-10C show the structure of FIGS. 9A-9C after patterned nitride 92 from FIGS. 9A-9C has been removed and after an etching operation has been carried out to remove portions of floating gate material 90 that are not covered by control gate oxide 102 to form discrete floating gates 110. Protrusions 95 now form lateral edges of discrete floating gates 110.

Figure 11A:
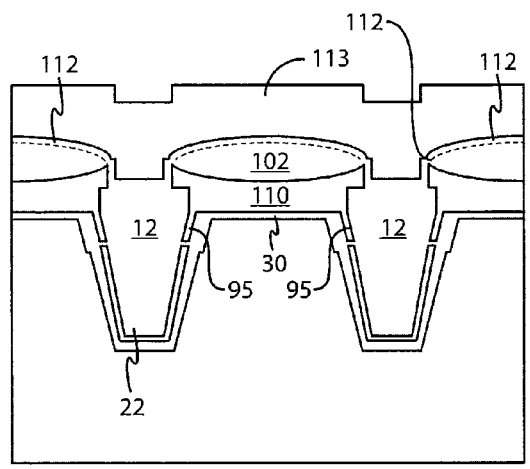
Figure 11B:
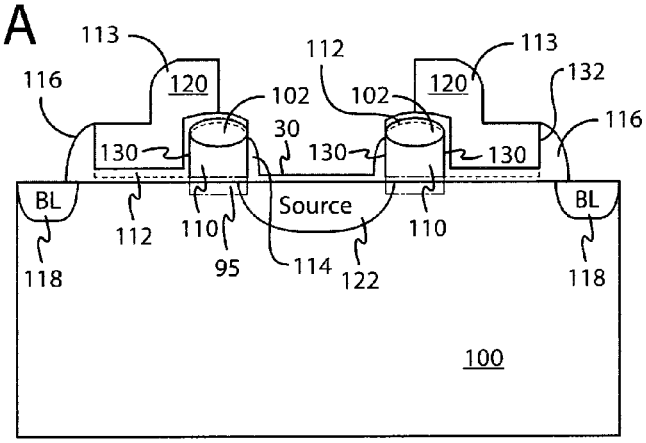
Figure 11C:
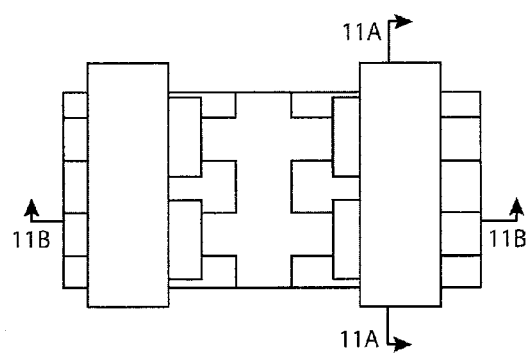

FIGS. 11A-11C show the structure of FIGS. 10A-10C after further processing operations have been carried out upon the structure shown in FIGS. 10A-10C. FIGS. 11A-11C show interpoly dielectric 112 and control gate material 113 formed over the structure shown in FIGS. 10A-10C. Various thicknesses for interpoly dielectric 112 and control gate material 113 are used in various embodiments. FIG. 11B shows the structure showing control gate material 113 patterned to form control gates 120.

FIG. 11B also shows inner spacers 114 and outer spacers 116. It can be seen that control gate 120 extends over portions of discrete floating gates 110, but also extends laterally past side edges 130 of discrete floating gates 110. Outer spacers 116 are formed adjacent outer edges 132 of control gates 120. FIG. 11B also shows common source area 122 formed within substrate 100 and disposed adjacent to both inner side edges 130 of floating gates 110. Common source area 122 is also disposed partially beneath discrete floating gates 110. FIG. 11B also shows bit line diffusion regions 118 formed laterally past outer edges 132 of control gates 120. Various suitable dopant impurity introduction methods such as ion implantation are used to form common source area 122 and bit line diffusion regions 118 according to various embodiments of the disclosure.

Protrusions 95 are shown in dashed line in FIG. 11B because protrusions 95 form the forward and rearward lateral edges of discrete floating gates 110 according to the orientation of the drawing of FIG. 11B and are not within the plane of the cross-sectional view presented in FIG. 11B. FIGS. 11A and 11B together show that protrusions 95 that form one set of opposed lateral edges of discrete floating gate 110, are oriented orthogonal to side edges 130 of discrete floating gates 110. FIG. 11B also shows that discrete floating gates 110, including protrusions 95, overlap common source area 122, although discrete floating gates 110 are spaced from common source area 122 by floating gate oxide 30. The addition of protrusions 95 compared to a floating gate having the same footprint and without the protrusions, produces an increased C1 capacitance between the discrete floating gate 110 and the common source area and thereby provides an increased coupling ratio, Cr, described above.

The thicknesses and other dimensions provided in the foregoing descriptions are the values used according to various embodiments of the disclosure, but other thicknesses and dimensions are used in other embodiments. In each case, the dimensions are selected to be suited to manufacturability, comply with design rules, and produce a device with specified functionality and performance.

According to one aspect, a floating gate transistor is provided. The floating gate transistor comprises: a floating gate having a central portion disposed over a substrate surface, a first lateral edge extending into a first trench and below the substrate surface and an opposed second lateral edge extending into a second trench and below the substrate surface. The floating gate transistor also includes a gate dielectric between the floating gate and the substrate surface and also between the first lateral edge and a sidewall of the first trench and between the second lateral edge and a sidewall of the second trench; a control gate at least partially over the floating gate; and a control gate dielectric between the floating gate and the control gate.

In some embodiments, the floating gate further includes opposed side edges being orthogonal to the first and second lateral edges and the control gate is disposed directly over and not extending laterally past the side edges of the floating gate.

In some embodiments, the floating gate further includes opposed side edges being orthogonal to the first and second lateral edges and the control gate includes a first portion disposed over at least a portion of the floating gate and a second portion extending laterally past one the side edge.

In some embodiments, the floating gate includes a concave upper surface and the control gate dielectric is biconvex in shape.

In some embodiments, the floating gate further includes opposed side edges being orthogonal to the first and second lateral edges and further comprising a source region disposed in the substrate surface adjacent one the side edge, and a bit line diffusion area formed in the substrate and laterally spaced from the opposed side edge.

In some embodiments, the first and second trenches are filled trenches that each include an oxide liner on the sidewalls thereof, a nitride layer over the oxide liner and a fill dielectric over the nitride layer and filling the associated trench and the first and second lateral edges extend into divots along respective upper edges of the first and second trenches.

In some embodiments, the floating gate is formed of polysilicon and the control gate dielectric is a composite dielectric formed of an oxide layer disposed over a nitride layer disposed over a further oxide layer.

Also provided is a floating gate flash cell comprising: two floating gate transistors and a common source area therebetween. Each floating gate transistor comprises: a floating gate having a central portion disposed over a substrate surface, a first lateral edge extending into a first trench and below the substrate surface and an opposed second lateral edge extending into a second trench and below the substrate surface; a gate dielectric between the floating gate and the substrate surface and also between the first lateral edge and a sidewall of the first trench and between the second lateral edge and a sidewall of the second trench; a control gate at least partially over the floating gate; and a control gate dielectric between the floating gate and the control gate. Each floating gate further includes opposed side edges being orthogonal to the first and second lateral edges and the common source area is a diffusion area in the substrate surface and positioned adjacent each of respective facing side edges of each floating gate transistor.

In some embodiments, the common source area further extends past each of the respective facing side edges of the floating gate transistors and beneath each of the respective floating gates.

In some embodiments, the floating gate further includes opposed side edges being orthogonal to the first and second lateral edges and each corresponding control gate is disposed directly over and not extending laterally past the side edges of the floating gates.

In some embodiments, the floating gate further includes opposed side edges being orthogonal to the first and second lateral edges and each corresponding control gate includes a first portion disposed over at least a portion of the floating gate and a second portion extending laterally past one the side edge.

In some embodiments, the floating gate includes a concave upper surface and the control gate dielectric is biconvex in shape.

In some embodiments, the respective second portions of the control gates extend past an opposed side edge of the associated floating gate in opposite directions and further comprising a bit line diffusion area formed in the substrate adjacent each of respective edges of the second portions.

In some embodiments, the trench is a filled trench and includes an oxide liner on sidewalls thereof, a nitride layer over the oxide liner and a fill dielectric over the nitride layer and filling the trench, the floating gate comprises polysilicon and the control gate dielectric includes an oxide layer over a nitride layer over a further oxide layer.

According to another aspect, a method for forming a floating gate transistor on a substrate is provided. The method comprises: forming a duality of trenches in the substrate; filling each of the trenches with at least one dielectric material; forming divots at upper lateral edges of the trenches; forming a gate dielectric over the substrate between the trenches and in the divots of the respective trenches; depositing a floating gate material over the floating gate dielectric over the substrate between the trenches and extending into each of the divots; patterning the floating gate material to form a floating gate with a central portion over the substrate and opposed lateral edges that extend into the divots; forming a floating gate dielectric over the floating gate; and forming a control gate over the control gate dielectric.

In some embodiments, the at least one dielectric material includes a protruding portion that extends over a surface of the substrate, the depositing includes depositing the floating gate material over the protruding portion and the patterning includes chemical mechanical polishing that removes the floating gate material from over the protruding portions.

In some embodiments, the patterning comprises forming a photolithographic pattern and etching.

In some embodiments, filling each of the trenches with at least one dielectric material comprises forming an oxide liner on sidewalls of each of the trenches, forming a nitride layer over respective oxide liners and forming a trench dielectric over the nitride liner and filling the trench, the forming divots comprises wet etching to remove a portion of the nitride layer and the oxide liner such that the divots extend downwardly from the substrate surface.

In some embodiments, forming a control gate comprises disposing the control gate disposed directly over and not extending laterally past side edges of the floating gate, the side edges being orthogonal to the first and second lateral edges.

In some embodiments, forming a control gate comprises forming the control gate with a first portion disposed over at least a portion of the floating gate and a second portion extending laterally past one side edge of the floating gate that is orthogonal to the first and second lateral edges.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A floating gate transistor comprising:
   a floating gate having a central portion disposed over a substrate surface, a first lateral edge extending into a first trench and below said substrate surface and an opposed second lateral edge extending into a second trench and below said substrate surface;
   a gate dielectric between said floating gate and said substrate surface and also between said first lateral edge and a sidewall of said first trench and between said second lateral edge and a sidewall of said second trench;
   a control gate at least partially over said floating gate; and
   a control gate dielectric between said floating gate and said control gate, wherein said first and second trenches are filled trenches that each include an oxide liner on said sidewalls thereof and a nitride layer over said oxide liner, said nitride layer having uppermost edges that terminate beneath said first and second lateral edges and beneath said substrate surface.

2. The floating gate transistor as in claim 1, wherein said floating gate further includes opposed side edges being orthogonal to said first and second lateral edges and said control gate is disposed directly over and not extending laterally past said side edges of said floating gate.

3. The floating gate transistor as in claim 1, wherein said floating gate further includes opposed side edges being orthogonal to said first and second lateral edges and said control gate includes a first portion disposed over at least a portion of said floating gate and a second portion extending laterally past one said side edge.

4. The floating gate transistor as in claim 3, wherein said floating gate includes a concave upper surface and said control gate dielectric is biconvex in shape.

5. The floating gate transistor as in claim 1, wherein said floating gate further includes opposed side edges being orthogonal to said first and second lateral edges and further comprising a source region disposed in said substrate surface adjacent one said side edge, and a bit line diffusion area formed in said substrate and laterally spaced from said opposed side edge.

6. The floating gate transistor as in claim 1, wherein said first and second trenches each include a fill dielectric over said nitride layer and filling said associated trench, said first and second lateral edges extend into divots along respective upper edges of said first and second trenches and said first and second lateral edges each have a lowermost surface that faces a corresponding one of said uppermost edges of said nitride layer.

7. The floating gate transistor as in claim 1, wherein said floating gate is formed of polysilicon and said control gate dielectric is a composite dielectric formed of an oxide layer disposed over a further nitride layer disposed over a further oxide layer.

8. The floating gate transistor as in claim 7, wherein said floating gate includes a concave upper surface, said control gate dielectric is biconvex in shape, said floating gate further includes opposed side edges being orthogonal to said first and second lateral edges and said control gate includes a first portion disposed over at least a portion of said floating gate and a second portion extending laterally past one said side edge.

9. The floating gate transistor as in claim 1, wherein said floating gate includes a concave upper surface and said control gate dielectric is biconvex in shape.

10. The floating gate transistor as in claim 1, wherein said first and second lateral edges extend into respective divots along respective upper edges of said first and second trenches.

11. A floating gate flash cell comprising:
two floating gate transistors and a common source area therebetween, each said floating gate transistor comprising:
a floating gate having a central portion disposed over a substrate surface, a first lateral edge extending into a first trench and below said substrate surface and an opposed second lateral edge extending into a second trench and below said substrate surface, each of said first and second trenches being a filled trench with an oxide liner on sidewalls thereof and a nitride layer over said oxide liner and said nitride layer having uppermost edges that terminate beneath said first and second lateral edges and beneath said substrate surface;
a gate dielectric between said floating gate and said substrate surface and also between said first lateral edge and a sidewall of said first trench and between said second lateral edge and a sidewall of said second trench;
a control gate at least partially over said floating gate; and
a control gate dielectric between said floating gate and said control gate,
wherein each said floating gate further includes opposed side edges being orthogonal to said first and second lateral edges and said common source area is a diffusion area in said substrate surface and positioned adjacent each of respective facing side edges of each said floating gate transistor.

12. The floating gate flash cell as in claim 11, wherein said common source area further extends past each of said respective facing side edges of said floating gate transistors and beneath each of said respective floating gates.

13. The floating gate flash cell as in claim 11, wherein each said floating gate further includes opposed side edges being orthogonal to said first and second lateral edges and each said corresponding control gate is disposed directly over and not extending laterally past said side edges of said floating gates.

14. The floating gate flash cell device as in claim 11, wherein each said floating gate further includes opposed side edges being orthogonal to said first and second lateral edges and each said corresponding control gate includes a first portion disposed over at least a portion of said floating gate and a second portion extending laterally past one said side edge.

15. The floating gate flash cell as in claim 14, wherein said floating gate includes a concave upper surface and said control gate dielectric is biconvex in shape.

16. The floating gate flash cell as in claim 15, wherein said respective second portions of said control gates extend past an opposed side edge of said associated floating gate in opposite directions and further comprising a bit line diffusion area formed in said substrate adjacent each of respective edges of said second portions.

17. The floating gate flash cell as in claim 11, wherein said trench includes a fill dielectric over said nitride layer and filling said trench, said floating gate comprises polysilicon, said control gate dielectric includes an oxide layer over a nitride layer over a further oxide layer and each of said first and second lateral edges have a lowermost surface that faces a corresponding one of said uppermost edges of said nitride liners.

18. The floating gate flash cell as in claim 11, wherein said floating gate includes a concave upper surface and said control gate dielectric is biconvex in shape.

19. The floating gate flash cell as in claim 18, wherein said first and second lateral edges extend into respective divots along respective upper edges of said first and second trenches.

20. The floating gate flash cell as in claim 18, further comprising said common source area extending beneath each said floating gate such that each said floating gate overlaps said common source area.

* * * * *